US 6,725,439 B1

(12) United States Patent
Homsinger et al.

(10) Patent No.: US 6,725,439 B1
(45) Date of Patent: Apr. 20, 2004

(54) METHOD OF AUTOMATED DESIGN AND CHECKING FOR ESD ROBUSTNESS

(75) Inventors: Philip S. Homsinger, Poughkeepsie, NY (US); Andrew D. Huber, Poughkeepsie, NY (US); Debra K. Korejwa, Charlotte, VT (US); William J. Livingstone, Underhill, VT (US); Jeannie H. Panner, Underhill, NY (US); Erich C. Schanzenbach, Dover Plains, NY (US); Douglas W. Stout, Milton, VT (US); Steven H. Voldman, South Burlington, VT (US); Paul S. Zuchowski, Cambridge, VT (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 09/678,742

(22) Filed: Oct. 4, 2000

Related U.S. Application Data

(62) Division of application No. 09/015,819, filed on Jan. 29, 1998, now abandoned.

(51) Int. Cl.$^7$ .............................................. G06F 17/50
(52) U.S. Cl. .................................... 716/12; 716/10
(58) Field of Search ................... 716/1, 2, 3, 4, 716/5, 6, 7, 8, 9, 10, 11, 12, 13, 14, 18

(56) References Cited

U.S. PATENT DOCUMENTS

| | | | | |
|---|---|---|---|---|
| 4,988,636 A | * | 1/1991 | Masleid et al. ............. 438/129 |
| 5,063,429 A | | 11/1991 | Crafts | |
| 5,155,065 A | * | 10/1992 | Schweiss ................... 438/599 |
| 5,430,602 A | | 7/1995 | Chin et al. | |
| 5,610,427 A | | 3/1997 | Shida | |
| 5,637,900 A | | 6/1997 | Ker et al. | |
| 5,648,910 A | * | 7/1997 | Ito .............................. 716/2 |
| 5,689,432 A | * | 11/1997 | Blaauw et al. ............. 716/18 |
| 5,796,638 A | * | 8/1998 | Kang et al. ................ 716/5 |
| 5,949,694 A | * | 9/1999 | Amerasekera et al. ...... 716/5 |
| 6,043,539 A | * | 3/2000 | Sugasawara ............... 257/357 |

OTHER PUBLICATIONS

Braiman et al., "Automated Generation of Custom Pad Cells for ASICs," IEEE 1991 Cstom ICS Conference, pp. 22.6.1–22.6.4.*
A. G. George, et al., "Packaging Alternatives to Large Silicon Chips: Toled Silicon on MCM and PWB Substrates", IEEE, 1996, pp. 699–708.
M, Ker, et al., "Whole–Chip ESD Protection Design for Submicron CMOS VLSI", IEEE, Jun. 1997, pp. 1920–1923.
P. Zuchowksi, et al., "I/O Impedance Matching Algorithm for High–Performance ASICs", ASIC 1997 Conference. no page #s.
B. Basaran, et al., "Latchup–Aware Placement and Parasitic–Bounding Routing of Custom Analog Cells", IEEE, 1993, pp. 415–421.
J. Easton, et al., "A System Engineering Approach to Design of On–Clip Electrostatic Discharge Protection", IEEE, 1996, pp. 22–28.

(List continued on next page.)

Primary Examiner—Leigh M. Garbowski
(74) Attorney, Agent, or Firm—McGuireWoods LLP; Richard Kotulak

(57) ABSTRACT

A integrated circuit (IC) chip with ESD robustness and the system and method of wiring the IC chip. Minimum wire width and maximum resistance constraints are applied to each of the chip's I/O ports. These constraints are propagated to the design. Array pads are wired to I/O cells located on the chip. Unused or floating pads may be tied to a power supply or ground line, either directly or through an electrostatic discharge (ESD) protect device. A multi-supply protect device (ESDxx) coupled between pairs of supplies and ground or to return lines is also included. Thus, wiring is such that wires and vias to ESD protect devices are wide enough to provide adequate ESD protection. Robust ESD protection is afforded all chip pads. The design may then be verified.

19 Claims, 8 Drawing Sheets

OTHER PUBLICATIONS

B. Rodgers, et al., "Attacking ESD", Circuits Assembly, Jun. 1995, p. 40 only.

S. Beebe, "Methodology for Layout Design and Organization of ESD Protection Transistors", EOS/ESD Symposium, 1996, pp. 265–275.

W. Russell, "Defuse the Threat of ED Damage", Electronic Design, Mar. 6, 1995, p. 115 only.

C. Duvury, et al., "ESD: A Pervasive Reliability Concenn for IC Technologies", Proceedings of the IEEE, vol., 81, No. 5, May 1993, pp. 690–702.

Jim Lipman, "Postlayout EDS Tools Lock Onto Full–Chip Verification", EDN, Oct. 10, 1996, pp. 93–104.

* cited by examiner

PowerPattern.GND_M4_UNUSED = {

MiddleType     = UNUSEDPIN
    MiddleOwner    = CHIP
    MiddleLayer    = M5

End1Type      = POWER
    End1Owner     = CHIP
    EndiLayer     = M5
    EndiProximity = 2000 MICRON ConnectNet    = GND
    ConnectLayer  = M4
    ConnectWidt   = 16.3 MICRON
    ConnectSwath  = 58.1 MICRON
    ConnectAxis   = AXISVER
}

FIG.6

```
PowerPattern.VDD_M4_ESD = {

MiddleType       = PIN
    MiddleOwner      = ESD
    MiddleLayer      = M2
    MiddleStart      = (70.0 MICRON, 0.0 MICRON, LOWER_LEFT)
    MiddleEnd        = ( 0.0 MICRON, 0.0 MICRON, UPPER_RIGHT)
    MiddleAxis       = AXISVER
    Middleproximity  = 180 MICRON End1Type         = POWER
    End1Owner        = CHIP
    End1Layer        = M5
    End1Proximity    = 2000 MICRON End2Type         = POWER
    End2Owner        = CHIP
    End2Layer        = M5
    End2proximity    = 2000 MICRON ConnectNet       = VDD
    ConnectLayer     = M4
    ConnectAxis      = AXISVER
    ConnectWidth     = 16.3 MICRON
    ConnectSwath     = 0 MICRON
}
```

FIG.7

METHOD OF AUTOMATED DESIGN AND CHECKING FOR ESD ROBUSTNESS

This application is a divisional of U.S. application Ser. No. 09/015,819 filed on Jan. 29, 1998, now abandoned.

RELATED APPLICATION

The present invention is related to U.S. patent application Ser. No. 09/015,825 entitled "Method of Automated ESD Protection Level Verification" to Bass et al., filed coincident herewith and assigned to the assignee of the present application now U.S. Pat. No 6,086,627 issued Jul. 11, 2000.

BACKGROUND OF THE INVENTION

1. Field of the Invention

The present invention generally relates to integrated circuit design, checking and verification and more particularly to methods of integrated circuit placement, wiring, checking and verification for electrostatic discharge robustness.

2. Background Description

Electrostatic discharge (ESD) protect devices, connected to integrated circuit (IC) chip's input/output (I/O) pads to protect circuits on the chip from ESD damage are well known in the art. ESD damage may result from ESD between any two chip pads. Typically, prior art ESD devices were designed and located based on well understood requirements of the particular circuit or, cell, and the physical characteristics of the chip technology and the ESD protect device. Thus, for a single power supply chip, the ESD device may have been, merely, a pair of reverse biased diodes, each connected between the supply or its return line (ground) and an IC chip signal pad.

The characteristics of (i.e., the level of protection afforded by) these prior art ESD protect devices were determined by the pad to ESD device wiring and the circuit attached to the pad. The design objective is to insure that the ESD device turns on before the circuit or wiring to the circuit fails. Thus, wiring between the pad and the ESD device must be wide enough to transfer the charge to the device without failing during the transfer.

However, even with a wire that is wide enough, if its resistance is too high, due to its length, the combination of the resistance and wiring/ESD device capacitance filters the charge provided to the ESD device, reducing its effectiveness. Under some circumstances, the wiring resistance in the I/O net wiring may act as a voltage divider. If the pad to device resistance is high enough, the voltage dropped across the divider resistance may prevent the device from ever turning on.

As long as what is typically referred to as the chip image (the template for an IC defining pad locations and chip size) is well defined, the above problems can be adequately addressed fairly simply by design. Thus, in FIG. 1 which shows an example of a prior art standard chip image 50, the chip has well defined circumferentially located I/O cells 52 and ESD protect devices (not shown) predefined power busses connected to an external connection pad 54. Circumferentially located signal pads 56 are connected through the ESD protect devices to I/O cells 52.

Typical electrical characteristics considered in designing an ESD network are: type of wiring metal (aluminum or copper, etc.), as well as wire and via (inter metal-metal layer connections) dimensions, i.e., widths, lengths, thicknesses and contact sizes. Thus, for a standard image 50 by design, each individual I/O cell may have a fixed, well defined internal resistance associated with it, thereby assuring the ratio of fixed wire resistance to internal cell resistance.

Advances in IC technology have increased circuit density, increasing the number of circuits on a single chip. The increase in the number of circuits has led to a corresponding increase in the number of pads for off chip connections, i.e., for chip inputs/outputs (I/Os) and for supplying power and ground to the chip according to what is well known in the art as Rent's Rule.

Consequently, to take full advantage of this increased IC chip gate count and complexity and to provide more locations for chip pad connections, standard chip images such as chip image 50 in FIG. 1 cannot be used.

Further, ESD protection is more complex on a multiple supply chip. Besides providing a supply path and a ground or return discharge path, paths must be provided from each pad 54 to each additional power supply line and each additional return line. Each signal pad 56 must be connected through an ESD protect device to each supply and each return. An ESD device for such a typical multi-supply IC chip may be nothing more than a string of diodes. Other chip characteristics, such as a power sequencing requirement, may further complicate the device.

So, for example, on a 2-supply chip, even a circuit in an I/O cell 52 connected to a single supply still requires a an ESD protection path through a device connected between its connecting pad and the unused (by that I/O circuit) supply. While this requirement may be met without difficulty for a standard image chip 50 by including protect devices periodically spaced around the chip's perimeter; it makes wiring an already complex chip even more difficult for a non-standard image chip.

Further complicating this, is that with the increased I/O count requirement on state of the art non-standard image IC chips, I/O cell placement is not restricted to the chip's periphery, the normal location for ESD devices. Instead, with a non-standard area array footprint, wires connecting I/O circuits to the chip pads are routed individually, either automatically by a design system or, interactively by a designer. Further, power busses are not as well defined and do not provide the extra protection from the added capacitance found on prior art standard images 50.

Thus, there is a need for integrated circuit chips with pad array interconnections having robust ESD protection and for a system and method for designing IC chips with robust ESD protection and verifying the IC chip design.

SUMMARY OF THE INVENTION

It is therefore a purpose of the present invention to improve integrated circuit chip ESD protection.

It is another purpose of the present invention to allow free form I/O cell placement on integrated circuit chip without impairing chip ESD protection.

It is yet another purpose of the present invention to verify ESD protection on integrated chips.

The present invention is a integrated circuit (IC) chip with ESD robustness and the system and method of designing and verifying the IC chip. Minimum wire width and maximum resistance constraints are applied to each of the chip's I/O ports. These constraints are propagated to the design. Array pads are wired to I/O cells located on the chip. Unused or floating pads may be tied to a supply or ground line, either directly or through an ESD protect device. A multi-supply protect device (ESDxx) coupled between pairs of supplies and ground or return lines is inserted. Thus, wiring is such that wires and vias to ESD protect devices are wider than signal wires. All chip pads have adequate ESD protection. The I/O power bus has robust ESD protection.

The design may then be verified.

BRIEF DESCRIPTION OF THE DRAWINGS

The foregoing and other objects, aspects and advantages will be better understood from the following detailed description of a preferred embodiment of the invention with reference to the drawings, in which:

FIG. 6 is an example of an instruction for connecting an unused external pad to ground;

FIG. 7 is an example of an instruction for connecting an appropriate supply voltage type to an I/O circuit having ESD devices;

DETAILED DESCRIPTION OF THE PREFERRED EMBODIMENTS OF THE INVENTION

Figure 1:
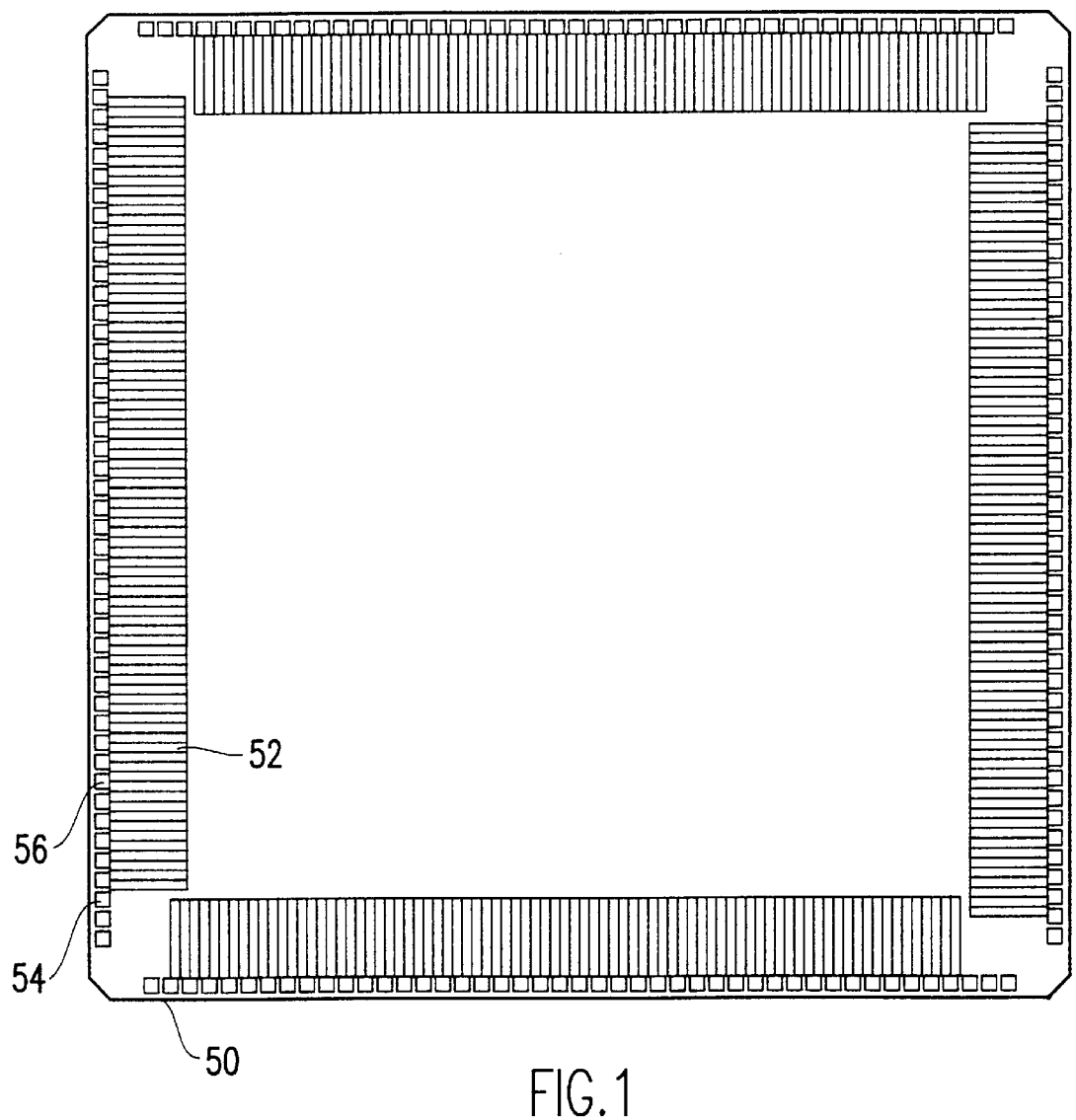
FIG. 1 shows a prior art standard image footprint.
Figure 2:
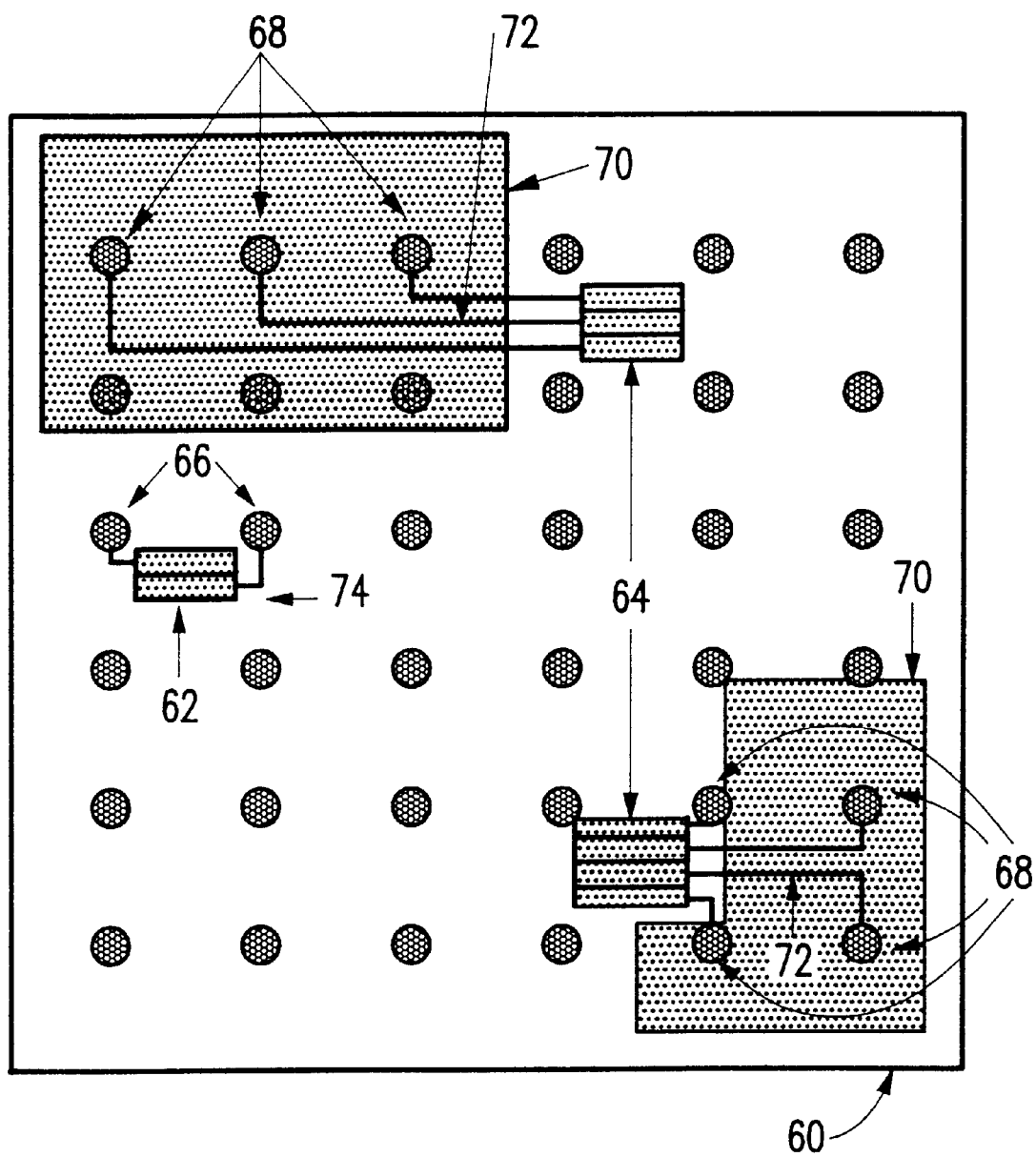
FIG. 2 shows an example of a chip designed according to the preferred embodiment method of the present invention.

Referring now to FIG. 2, which shows a pad array chip 60 designed according to the preferred embodiment method to provide robust I/O and power connections. I/O circuits instances 62, 64 may be located throughout the chip 60 and are connected to pads 66, 68. Pads 68 are located over core circuit areas 70. Nets 72 between I/O cell instances 64 and pads 68 and nets 74 between I/O cell instances 62 and pads 66 having been formed according to the preferred embodiment design method have robust ESD protection.

According to the preferred embodiment method, each I/O instance 62, 64 includes an ESD protect device and connection between the ESD device therein and the cell's active circuitry. Thus, the preferred embodiment method is intended for IC chips 60 where power distribution is a mesh of wires on several conductive (metal) levels. The mesh is modifiable to allow the addition of large circuit blocks, sometimes referred to as megacells or large memory bocks. Each power supply is represented as a single network, e.g., there is a single VDD net with all circuits requiring VDD connected to the VDD net. External pad locations are predefined and have predefined functions, i.e., predefined as power supply or signal for inclusion in pre-designed packaging.

Three sources of technology library information are included with each preferred embodiment application specific IC (ASIC) design. These three sources include a technology file, an IC image information file, and individual circuit files for each circuit in the technology library.

The technology file contains information that is constant for all IC images and all circuit elements. The technology file contains predefined allowable wire widths and RC information for these widths. Also, the technology file includes a lookup table for obtaining information concerning minimum wire width and maximum resistance constraints.

The image files contain information about a default power grid, location and function of the external pads, allowable I/O circuit instance placement rules, instructions for dealing with any external pads left unused, instructions for modifying the base power grid around large circuit elements, and placement requirements for an ESDxx circuit.

Power bus information is included as pattern specifications, used by a power bus router to insert power bussing into the IC design as required. Included in this power bus pattern specification is a series of instructions that allow the power bus router to enhance power distribution in the vicinity of I/O circuits. This ensures that I/O circuit power route wires are wider than a minimum width and have line resistance below a maximum resistance sufficient to provide a minimum level of ESD protection, i.e., that the ESD network is robust enough to handle ESD events within a specified range.

The unused pad specification lists a wire width to be used when routing connections between unused external pads and the nearest power buses. This ensures that each unused external pad is connected to the power distribution net with a connection robust enough to handle an ESD event.

If necessary, a pointer for each connection point, commonly referred to as a "pin", may be included in each circuit's circuit file. These pointers would reference information in the technology file regarding maximum resistance and minimum wire width constraints for any net connected to the pin associated with the pointer.

Although the preferred embodiment of the present invention was developed to function on the IBM® ChipBench design tool, the present invention maybe adapted for any suitable design tool.

Figure 3:
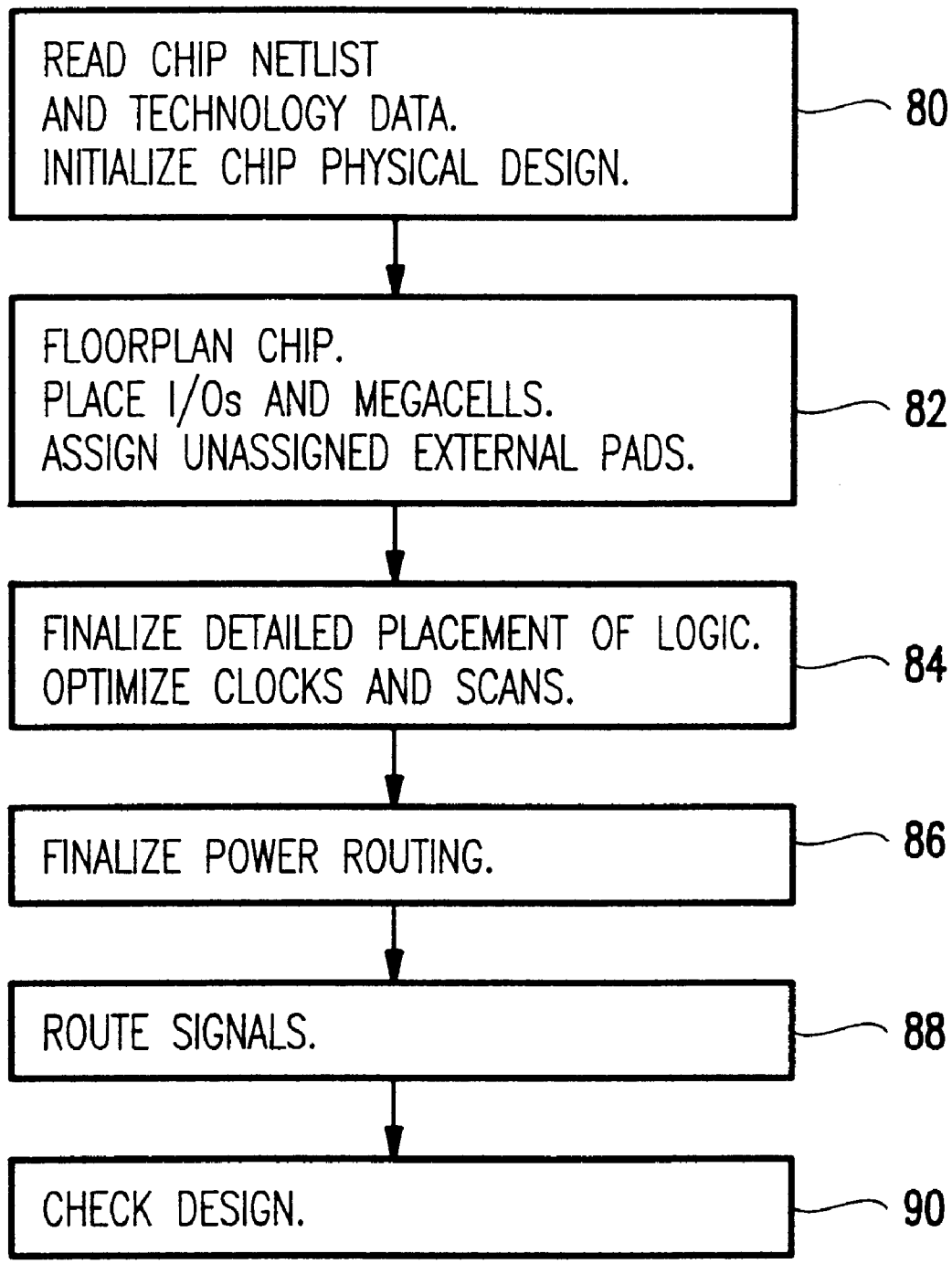
FIG. 3 is a flow chart of the preferred embodiment method of ASIC design and checking.

FIG. 3 represents the preferred embodiment IC physical design method to ensure ESD robustness. In the preferred method, the chip is designed using circuit and image abstracts without device-level checking. All ESD ground rules are checked in I/O circuits prior to chip design, prior to being used on the chip.

Thus, in step 80, the chip net list and the technology data needed for physical design and checking are read into the tool. Also, the chip physical design database is initialized, which includes supplying a base chip image and power grid to the tool. The chip's logic pins may be only partially assigned to external pads.

In step 82, the chip floorplan is determined using both interactive manual tools and automatic tools. At this stage, chip logic pins are assigned to chip pads, objects are placed in the image, global routes are created, and the design is analyzed. After this step 82, the completed floorplan has megacells and I/Os placed; all external pads assigned; approximate placement set for the logic; the power grid; and, the placed design has been analyzed to determine whether it is wireable, meets timing requirements and satisfies technology constraints.

Next, in step 84, logic placement details are finalized. This may include minor logic placement perturbation or full timing-driven re-placement, including clock tree (clock distribution) optimization to minimize skew and latency and meet previously defined objectives, as well as optimizing scan nets.

Next, in step 86, the power routing is finalized by customizing the base power grid for the chip. This step may also include truncating the power grid at power rings of megacells and, enhancing the base power grid in areas where required, e.g. near I/O circuit instances. In step 88, signals are routed. Wide wires, wires wider than a minimum width, may be routed in advance of the rest of the design nets or, concurrently (on the fly) as minimum width nets are routed.

Finally, in step 90, the design is checked at the abstract level. All design rules (logical, physical/electrical, test design rules) are checked against technology requirements. The design should be correct by construction at the device level.

I/O cells and the IC in general may be checked. at the device level, as described in related to U.S. patent application Ser. No. 09015,825 entitled "Method of Automated ESD Protection Level Verification" to Bass et al., filed coincident herewith and assigned to the assignee of the present application and incorporated herein by reference now U.S. Pat. No 6,086,627 issued Jul. 11, 2000.

After checking, the resulting ASIC may be manufactured using well known techniques.

Figure 4:
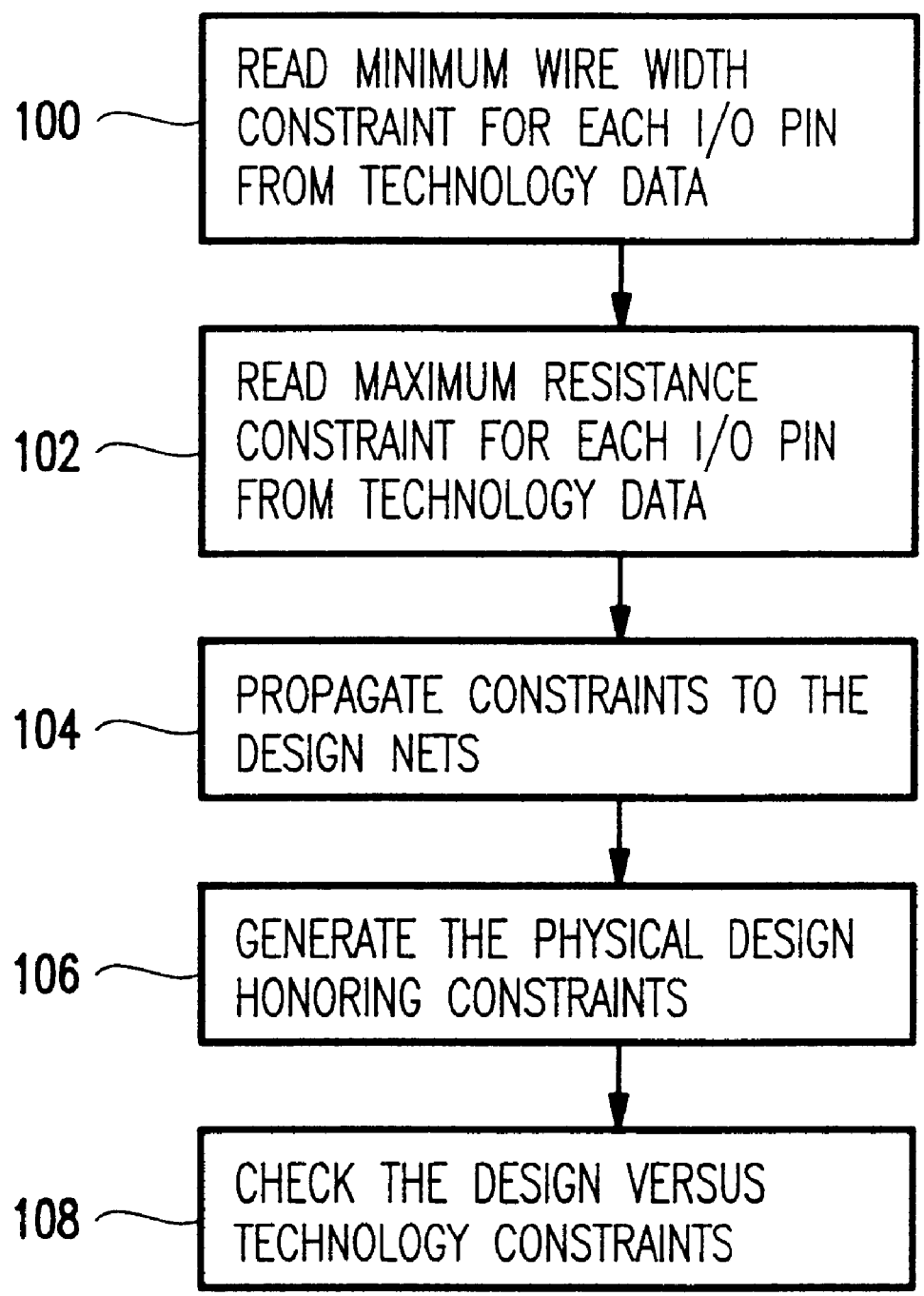
FIG. 4 is a flow chart of the preferred embodiment method of ASIC design for I/O circuit instance to pad connection for ESD robustness.

FIG. 4 is a flow chart of the preferred embodiment method of ASIC design for I/O signal ESD robustness. First, in step 100, technology data that includes minimum wire width constraints on I/O cell pin to external signal pad connections is provided.

The tool reads these minimum wire width constraints from the technology data. This first constraint, wire width, is technology dependent and is the minimum value required both to ensure acceptable ESD protection and to meet any wire electromigration requirements. This first constraint, which may vary layer by layer, is specified as a wire width for each routing layer and as a minimum via number and minimum via area for each interlevel via layer.

Next, in step 102, maximum resistance constraints are read from the technology data. The technology data also includes maximum pin resistance allowed between the I/O cell pin and an external signal pad. These resistance constraints ensure acceptable circuit ESD protection.

The constraints are applied individually to each net as follows: 1) All pins on a net are inspected to determine worst-case constraints for the net; and, 2) The determined worst-case constraints are applied to the whole net. So, for example for determining the minimum wire width constraint for any particular net, the worst-case constraint for the net is the maximum of the set of minimum wire width constraints found on all the pins of the net. For the maximum resistance constraint, the worst-case constraint is the smallest maximum resistance constraints on all of the pins of the net.

So, in step 104, at the beginning of physical design, the design system propagates I/O cell pin constraints in the technology data to the ASIC's net constraints, where they are applied by the design tool. Thus, every net that includes a connection between an I/O cell instance pin and an external signal pad has a minimum wire width constraint and a maximum resistance constraint. Optionally, these net constraints may be manually overridden with more stringent constraints by the designer.

The next step 106 is chip physical design, as described hereinabove with respect to FIG. 3 taking into account net constraints in floorplanning, placement, and signal routing tools. The floorplanner uses the constraints during chip pad assignment to I/O circuit instance pins.

Net constraints are included in the cost functions that drive the decisions made by the placement tools. If after placement, no route exists for a net, the tools estimate the net resistance using the net's minimum wire width constraint and a Steiner route. The net wire width constraints are followed by the signal routing tools.

In step 108, the maximum resistance I/O pin constraints in the technology data are applied to each design net connected to an external pad by the checking tool. Each net's total resistance is compared to the maximum resistance net constraint. This check may be done prior to routing a net using an estimated route for the net. Similarly, the I/O pin minimum wire width constraints in the technology data are applied to each net connected to an external pad by the checking tool. A smallest wire width is determined for each net and compared to the minimum wire width constraint.

Any I/O nets failing the checks may be fixed by changing the pad assignment of the I/O pin, by changing the location of the I/O cell, by widening the failing wire to increase allowable wire length, or by rerouting the net.

At physical design completion, the checking program verifies that all nets satisfy the technology constraints. Preferably, the checking program is run earlier to minimize fixes and overall design time. Thus, having identified any failures or a constraint violation, the design may be altered to correct the violation.

Figure 5:
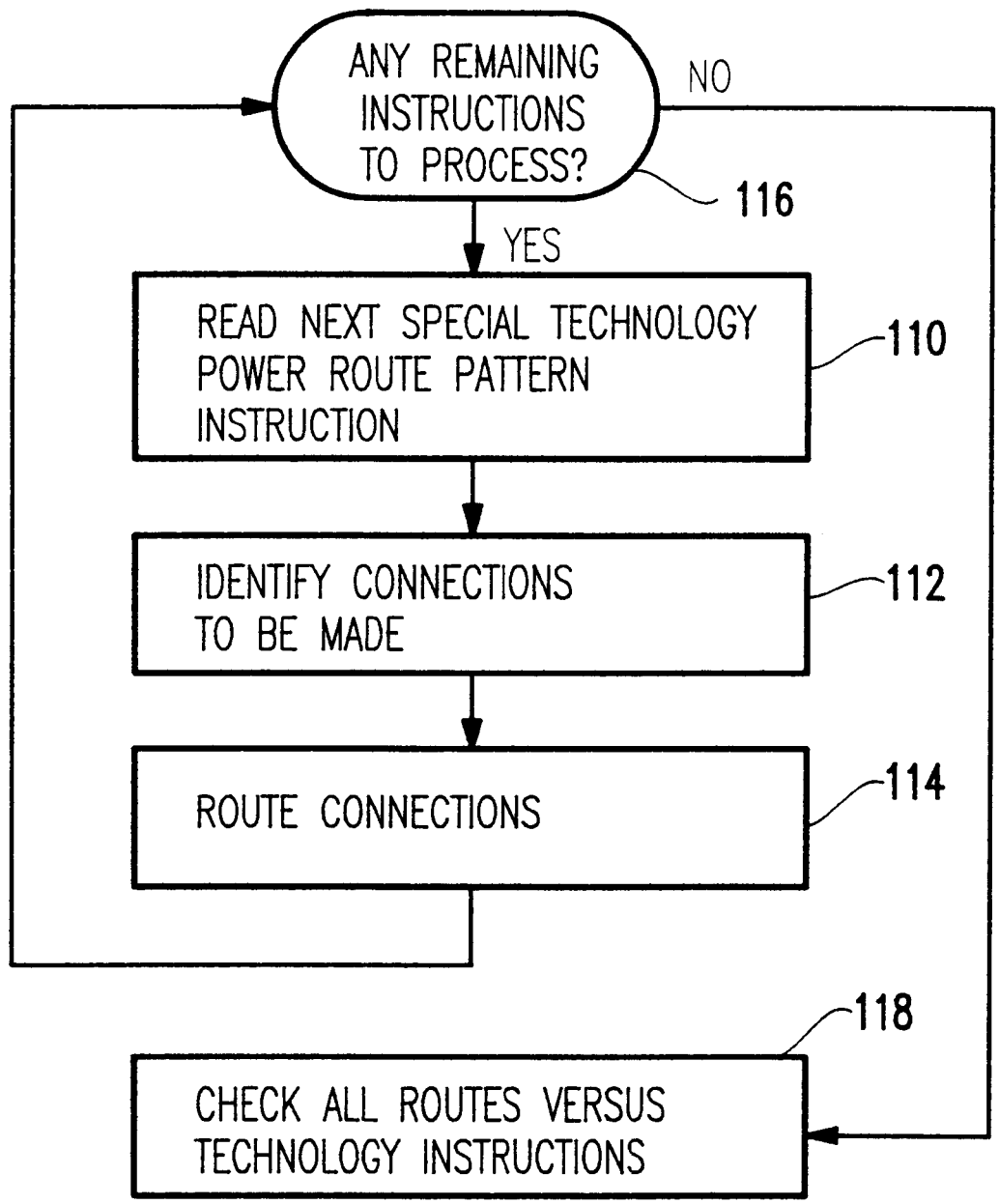
FIG. 5, which is a flow chart of a second preferred embodiment method that insures ESD robustness for unused external pads and for I/O power distribution.

FIG. 5, which is a flow chart of a second preferred embodiment method, that insures ESD robustness for unused external pads and for I/O power distribution and may be combined with the first preferred embodiment. Unused external pads are not identifiable, nor is the location of I/O circuits containing ESD protect devices known until the IC is being personalized. However, the unused pads must be connected to ground and the I/O circuit ESD protect devices must be connected to an appropriate voltage type.

In the second preferred embodiment method, technology dependent instructions are provided in step 110 to a power route program, each instruction describing one pattern of power metal to be generated. Figured is an example of an instruction for connecting an unused external pad to ground. FIG. 7 is an example of an instruction for connecting an appropriate supply voltage type to an I/O circuit with ESD devices, or an ESDxx cell.

Each instruction includes a section characterizing the connection being made and a section with the metal parameter necessary for creating a robust connection. As each instruction is read a pattern is created. Patterns are order dependent. Subsequent patterns may rely on shapes created by earlier patterns.

Thus, for a given instruction, the power route program, in step 112, by identifies objects to be connected. One instruction can select many objects. Each selected object satisfies a number of criteria set forth in the instruction. The selected objects must be of a specified type. Object types include power service terminals (pins), power routes, and unused external pads.

Further, selected objects must belong to a circuit in a specified library circuit group or belong to the IC. Library circuit groups are established as part of the technology. A circuit can belong to one or more library groups. The selected object must occur within a specified region relative to the circuit which owns the object and upon any one layer of a specified set of layers.

Each object is associated with one of two ends or the middle of the connection. Ultimately, the end of a connection is associated with a single object. Any number of objects may be associated with the middle of a connection. The selected objects forming the connection must be located within a rectangle. The middle objects occur within the rectangle and the two end objects occur at the ends of the rectangle.

The objects selected by reading one instruction are not necessarily associated with a single connection. Objects are divided into connections based upon the selected middle objects. The middle objects must be approximately aligned along a specified axis and must occur within a specified proximity of each other. Any middle objects satisfying these constraints are associated with one connection. The creation of multiple connections may be necessary in order for all middle objects to be included in a connection. End objects must be within a specified proximity of a middle object and must be aligned with the middle objects along the given axis. The closest such end object is associated with the connection of middle objects. If no end object satisfies the above constraint, a connection is created without an end object.

At the end of the identification phase for an instruction, a set of connections has been identified. Each connection includes at least one middle object. The end objects may not always be present. However, normally there is an end object, a sequence of middle objects and a second end object. Further, the set of objects forming the connection are approximately aligned along a specified axis.

In step 114, each connection is routed as a continuous metal shape connecting shapes of objects. Routing avoids obstacles according to constraints specified in the instruction creating the power routing connection. Each power route metal shape is constrained to occur within a guide box derived from a parameter in the instruction and the location of objects in the connection.

In step 116 the technology data is inspected for remaining instructions. If any instructions remain to be processed, then return to step 110. Otherwise proceed to step 118. As a result unused external pads are connected to an ESD network, e.g., ground and every I/O circuit instance power pin has a robust connection to an appropriate power supply.

Finally, to avoid having errors inadvertently introduced in the ASIC design, in step 118 a checking program verifies the design. The checking program independently reads the technology power routing instructions and the chip design. The power routes are traced for the connections to be made. Routes are compared to the technology instructions (e.g., width by metal layer). If design errors indicate that a connection fails to meet minimum technology criteria, an error report is generated and the design must be corrected.

So, in the example of FIG. 6, an instruction (PowerPattern) results in metal connecting an unused external pad (MiddleType) of the chip (MiddleOwner) to a ground power (End1Type, ConnectNet) of the chip (End1Owner). Only unused pads on layer M5 (MiddleLayer) anywhere within the chip are considered. Only ground power located on layer M5 (End1Layer) of the chip are considered. The ground power must be within 2000 microns (End1Proximity) of the unused pad. The metal that is created is associated with the ground net (ConnectNet). The ground net is located on layer M4 (ConnectLayer) and has a width of 16.3 microns (ConnectWidth). Its route is allowed to vary 58.1 microns (ConnectSwath) about a vertical line (ConnectAxis) in order to avoid obstacles. Vias are added between the metal on M4 and the pad on M5 and the power on M5 as needed.

In the example of FIG. 7, an instruction (PowerPatten) is one of several that result in metal connecting possibly several VDD power pins (MiddleType, ConnectNet) of the cells in the library cell group ESD (MiddleOwner) to a VDD power (End1Type, End2Type, ConnectNet) of the chip (End1Owner, End2Owner). Only power pins on layer M2 (MiddleLayer) within the a specified region (MiddleStart, MiddleEnd) of a cell above are considered. Only VDD pins located on layer M5 (End1Layer, End2Layer) of the chip are considered. There may be several VDD power pins in the same connection provided they are positioned along a vertical axis (MiddleAxis) and are within 180 microns (MiddleProximity) of another. A VDD power must be at either end of the pins and within 2000 microns (End1Proximity, End2Proximity) of a pin. The metal that is created is associated with the VDD net (ConnectNet). It is located on layer M4 (ConnectLayer) and has a width of 16.3 Microns (ConnectWidth). Its route Must be perfectly straight (ConnectSwath) along a vertical line (ConnectAxis). Another instruction is used to create metal on M3 and vias are used as needed to finalize the connection.

An alternative embodiment to ensure ESD protection for unused signal pads is to connect such a pad to an instance of a special library cell containing an active ESD device or a direct connection to a power supply within the cell. In this embodiment, the netlist would contain the circuit instance, which would be placed with the other I/O circuit instance placement. The net would be routed by the signal router and the robustness of the connection would be checked with the other signal routes. This alternative embodiment would follow the method of FIG. 4.

Figure 8:
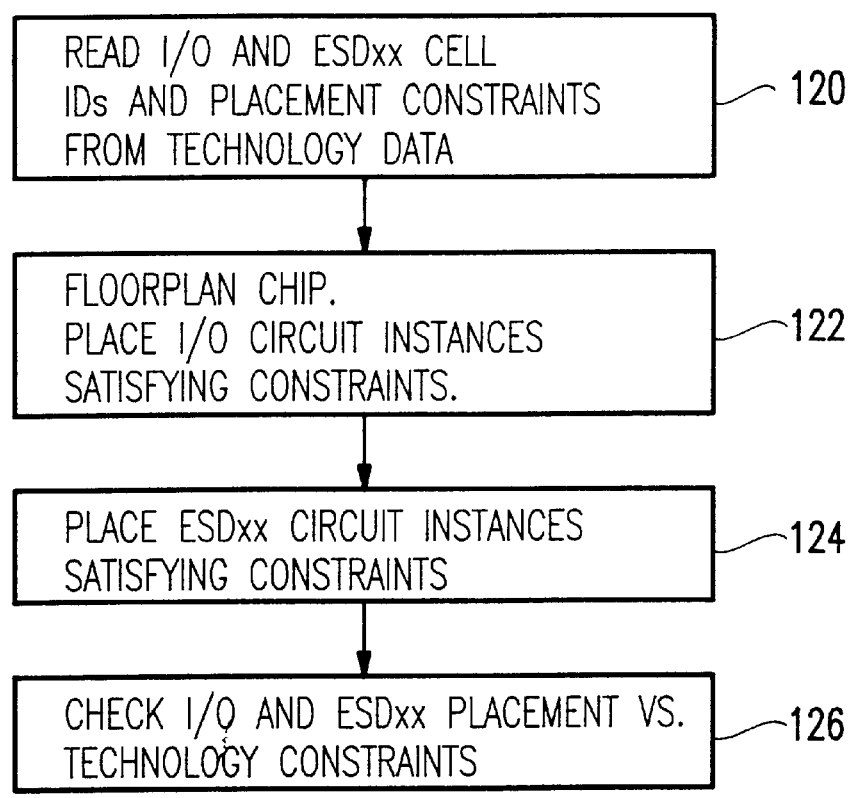
FIG. 8 is a flow chart of a preferred embodiment method for insuring ESD robustness on multiple power supply chips.

FIG. 8 is a flow chart of a third preferred embodiment method for ensuring ESD robustness on multiple power supply chips. In the preferred embodiment, a robust ESD mesh exists everywhere on the IC for VDD1. The VDD2 supply is routed only to I/O circuit instances requiring that supply. On multiple power supply ICs (e.g., an IC with VDD1 and VDD2 power supplies) a multi-supply protect device, referred to herein as an ESDxx device must be included. Instances of the ESDxx device must be in a sufficient ratio and proximity to I/O circuit instances utilizing VDD2 to ensure ESD robustness. By ensuring the proximity to the ESDxx device to I/O circuit instances, a low resistance power bus network is guaranteed. The I/O circuit instances themselves may also have placement constraints for various reasons.

Figure 9:
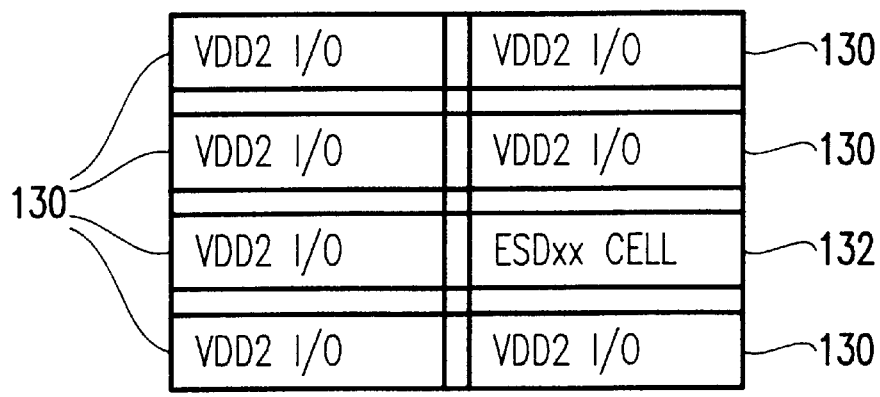
FIG. 9 shows I/O circuit instances on a multi-supply IC that are grouped together physically in a configuration with an ESDxx circuit instance embedded in the group.

First, in step 120, I/O and ESDxx cells are identified and read from technology library data along with the placement constraints for each cell type. So, for example as represented in FIG. 9, there may be a requirement that I/Os requiring VDD2, e.g. 130, be grouped together physically in certain configurations that guarantee robust power routing. Still another requirement might be to provide an ESDxx cell, e.g. 132, for each such physical group 134, with the ESDxx circuit 132 instance embedded in or, abutted to the group 134. The example in FIG. 9 shows a 2×4 group 134 of I/O circuit instances 130 wherein the ESDxx cell 132 is embedded.

Alternatively, I/O cells may not be required to be grouped together, but may be allowed to be placed freely. All I/O circuit instances would be connected to multiple supplies through the ESDxx devices. In this case, some number of ESDxx cells may be required for I/O cells within a particular region, based on the power supply network's physical and electrical configurations.

So, next, in step 122, the chip floorplan is determined and all I/O circuit instances are placed according to technology placement constraints. Then, in step 124, the I/O circuit instance placements are analyzed to determine the number of ESDxx circuit instances that are required. The required number are added to the netlist and placed according to the technology constraints. Finally in step 126, I/O and ESDxx cell placement are checked by an independent checking program which checks each cell placement against the technology constraints to determine whether the design meets these minimum requirements.

It is understood that an IC may include two or more power supplies and, further may include one or more ground or return lines with appropriate modification. Such a chip would also include appropriately designed ESDxx cells placed in appropriate locations.

While the invention has been described in terms of preferred embodiments, those skilled in the art will recognize that the invention can be practiced with modification within the spirit and scope of the appended claims.

We claim:

1. A chip design method comprising the steps of:
   a) retrieving a wire width constraint from technology data for an I/O cell of a chip;
   b) retrieving a maximum resistance constraint from said technology data for said I/O cell;
   c) propagating said wiring width constraint and said maximum resistance constraint to net design data for said chip;
   d) generating said chip, comprising the steps of:
      constraining connections between said I/O cell and an associated pad by said propagated constraints;
      providing a plurality of ESDxx cells; and
      connecting said plurality of ESDxx cells between power rails and power return rails for at least two different power supplies; and
   e) checking said wired integrated circuit.

2. The method of claim 1, wherein a plurality of I/O cells are wired and further comprising before the checking step (e), repeating steps (a)–(d) for each of said plurality of I/O cells.

3. The method of claim 2, further comprising before the checking step (e), the step off wiring any unused chip pads to one of said I/O cells including a connection to said power rails or to said power return rails.

4. The method of claim 2, further comprising before the checking step (e), the step of wiring any unused chip pads to one of said ESDxx cells.

5. The method of claim 2, wherein the generating step (d) comprises the steps of:
   i) placing each of said IO cells based on said propagated wire width and maximum resistance constraints; and
   ii) routing a connection between each said placed I/O cell and its said associated pad, each said routed connection meeting said propagated wire width and maximum resistance constraints.

6. The method of claim 5, where the checking step (e) comprises checking connections made in said generating step (d) against said propagated wire width and maximum resistance constraints.

7. A chip design method comprising the steps of:
   a) retrieving a power route pattern induction;
   b) identifying power and power return connections;
   c) routing each said power and each said power return connection, each said routed connection meeting wire width and maximum resistance constraints in said retrieved power route pattern instruction, wherein the routing step includes the steps of:
      it providing an ESDxx cell; and
      ii) connecting said ESDxx cell between power rails and sower return rails for at least two different power supplies; and
   d) checking said wired integrated circuit.

8. The method of claim 7, wherein the routing step (c) further includes the step of identifying unused pads and wiring said unused pad to said power rails or to said power return rails.

9. The method of claim 7, wherein the routing step (c) further includes the step of identifying unused pads and wiring said unused pad to a cell including an ESD protect device.

10. A chip design method comprising the steps of:
    a) retrieving identifications and placement constraints of a plurality of I/O cells and a plurality of ESDxx cells;
    b) providing said plurality of I/O cells for placement according to said placement constraints;
    c) placing each of said plurality of ESDxx cells with said plurality of I/O cells;
    d) connecting each of said placed ESDxx cells between power rails and power return rails for at least two different power supplies; and
    e) checking said wired integrated circuit.

11. A system for integrated circuit chip design comprising:
    means for retrieving net constraints from technology data;
    means for placing a plurality of I/O cells;
    means for placing a plurality of ESDxx cells;
    means for connecting each of said placed I/O cells to an I/O pad according to said retrieved net constraints; and
    means for connecting said placed ESDxx cells between power rails and power return rails for at least two different power supplies.

12. The system of claim 11, wherein said retrieved constraints include power bussing constraints, said system further comprising means for routing power and power return connections according to said power bussing constraints.

13. The system of claim 11, further comprising:
    means for grouping I/O cells; and
    means for placing said plurality of ESDxx cells with said grouped I/O cells.

14. A computer readable medium comprising instructions for a computer implemented chip design method, said method comprising the steps of:
    a) retrieving a wire width constraints from technology data for an I/O cell;
    b) retrieving a maximum resistance constraint from said technology data for said I/O cell;
    c) propagating said wiring width constraint and said maximum resistance constraint to net design data for said chip;
    d) generating said chip, comprising the steps of:
       constraining connections between said I/O cell and an associated pad by said propagated constraints;
       providing a plurality of ESDxx cells; and
       connecting said plurality of ESDxx cells between power rails and power return rails for at least two different power supplies; and
    e) checking said wired integrated circuit.

15. The computer readable medium comprising instructions as recited claim 14, wherein a plurality of I/O cells are wired and further comprising before the checking step (e), repeating steps (a)–(d) for each of said plurality of I/O cells.

16. The computer readable medium comprising instructions as recited in claim 15, further comprising before the checking step (e), the step of wiring any unused chip pads to one of said I/O cells including a connection to power rail or to a power return rail.

17. The computer readable medium comprising instructions as recited in claim 15, further comprising before the checking step (e), the step of wiring any unused chip pads to one of said ESDxx cells.

18. The computer readable medium comprising instructions as recited in claim 15, wherein the generating step (d) comprises the steps of:

i) placing each of said I/O cells based on said propagated wire width and maximum resistance constraints; and ii) routing a connection between each said placed I/O cell and its said associated pad, each said routed connection meeting said propagated wire width and maximum resistance constraints.

19. The computer readable medium comprising instructions as recited in claim 18, wherein the checking step (e) comprises the step of checking connections made in said generating step (d) against propagated wire width and maximum resistance constraints.

\* \* \* \* \*